(12) United States Patent
Chigira et al.

(10) Patent No.: US 6,437,651 B2
(45) Date of Patent: Aug. 20, 2002

(54) OSCILLATING CIRCUIT

(75) Inventors: Hirokazu Chigira; Masao Okumura, both of Gunma; Tatsuro Koyanagi, Tokyo; Naoshi Mashimo; Tomoyuki Saito, both of Gunma; Mitsuo Osawa, Saitama; Nobukazu Hayakawa; Kouki Kubo, both of Gunma, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/821,576

(22) Filed: Mar. 29, 2001

(30) Foreign Application Priority Data

May 30, 2000 (JP) ......................................... 2000-159713

(51) Int. Cl.$^7$ .............................. H03B 1/04; H03B 5/02
(52) U.S. Cl. ................... 331/108 C; 331/105; 331/175; 331/185

(58) Field of Search ...................... 331/68, 105, 108 R, 331/108 C, 108 D, 116 R, 116 FE, 117 R, 117 FE, 117 D, 175, 185, 187

(56) References Cited

U.S. PATENT DOCUMENTS 6,320,474 B1 * 11/2001 Kimaya et al. ......... 331/177 V

* cited by examiner

*Primary Examiner*—David Mis
(74) *Attorney, Agent, or Firm*—Fish & Richardson P.C.

(57) ABSTRACT

An electric potential of an epitaxial layer 2A provided under a bonding pad 5 to which a resonance circuit for a VCO is to be connected is fixed to a predetermined (Vcc) electric potential through a resistor 6 in a conventional floating state. Consequently, a speed of a change in the electric potential of the epitaxial layer 2A is increased and a value of a parasitic capacity is stabilized quickly. Consequently, a drift can be improved when a power supply is turned ON.

10 Claims, 4 Drawing Sheets

OSCILLATING CIRCUIT

BACKGROUND OF THE INVENTION

The present invention relates to an oscillating circuit, and particularly, to an oscillating circuit to be used for a video signal receiving device having an improved VCO (voltage controlled oscillator) free run frequency characteristic, particularly, which serves to detect a video in a PLL (phase-locked loop) type video detecting circuit, for example.

In the PLL type video detecting circuit, a VCO circuit for locking to an input signal to detect a video is used. The VCO circuit regulates a free run frequency into an IF frequency (for example, 45.75 MHz specified for U.S.) to be used by means of an externally provided resonance circuit 51 formed by a variable coil L1 and a capacitor C1 as shown in FIG. 4. The resonance circuit 51 is connected to an oscillator 52 provided in an IC through an IC pin 54 of a lead frame (not shown) and a bonding pad 53 for connecting with an IC terminal. The resonance circuit may be constituted by an internal element (a capacitor C2 shown in a dotted line of FIG. 4) of an integrated circuit and the externally provided variable coil L1 in place of the externally provided capacitor C1.

In a VCO for video detection, a free run frequency is determined by the resonance circuit 51 and is locked to an input frequency through the PLL operation of an APC (automatic phase control) circuit. When an IC power is turned ON, an electric potential of an island provided under the bonding pad 53 is changed so that a floating capacity of the bonding pad is varied, resulting in a drift of the VCO free run frequency. In the case in which an AFT (automatic frequency tuning) voltage is to be generated by utilizing a change in the APC voltage with respect to the frequency, the drift appears as a drift of an AFT voltage. Since the AFT has a very high sensitivity, the drift causes a center voltage to be shifted.

For this reason, when a VCO coil is to be varied and regulated to generate a desirable AFT voltage, a VCO oscillating frequency cannot be regulated accurately or the regulation takes a great deal of time and labor if a drift is caused while the IC power is ON.

The cause will be described below with reference to a sectional view showing a bonding pad structure in FIG. 5. An IC bonding pad 63 is provided on an island formed in a P-type semiconductor substrate 61 which will be hereinafter referred to as an N-type epitaxial layer 62, for example. The epitaxial layer 62 provided under the pad is set in a floating state on an electric potential basis.

The bonding pad 63 is formed of a metal layer, a MOS capacitance Cm is formed between the epitaxial layer 62 and a single-layered metal 63A provided through an oxide film 64, and a junction capacitance Cj is formed between the (N-type) epitaxial layer 62 and the (P-type) substrate 61 (see FIGS. 5 to 7). Values of the parasitic capacities are changed depending on a difference in an electric potential between the epitaxial layer 62 and the substrate 61.

In the case in which the epitaxial layer 62 provided under the pad 63 is set in the floating state, differences in an electric potential determined by the values of the MOS capacitance Cm and the junction capacitance Cj are caused between the pad 63 and the epitaxial layer 62 and between the epitaxial layer 62 and the substrate 61 when a voltage is applied to the pad 63. Consequently, a very small leakage current (dark current) is generated from the epitaxial layer 62 to the substrate 61 of a chip. Therefore, a long time is taken until the electric potential of the epitaxial layer 62 is stabilized to be equal to that of the substrate 61. Therefore, the value of the parasitic capacity between the single-layered metal 63A and the epitaxial layer 62 is successively changed before the electric potential of the epitaxial layer 62 is stabilized to be equal to that of the substrate 61.

This change in the capacity influences the capacity of the resonance circuit 51 so that a frequency drift is generated when the power supply is turned ON.

SUMMARY OF THE INVENTION

In consideration of the problems, the invention is intended for fixing an electric potential of an epitaxial layer provided under a bonding pad to which a resonance circuit for a VCO is connected to a predetermined electric potential through a resistor, thereby increasing a speed of a change in the electric potential of the epitaxial layer and quickly stabilizing a value of a parasitic capacity, resulting in an improvement in a drift when a power supply is turned ON.

Moreover, an island provided under the bonding pad is fixed to have a predetermined electric potential through a resistor formed in another island.

Furthermore, the predetermined electric potential to which an electric potential of the island provided under the bonding pad is to be fixed is a Vcc voltage or a GND voltage.

Moreover, the bonding pad is formed in a position shifted from a position where a contact portion to be connected to the resistor is wire-bonded.

DETAILED DESCRIPTION OF THE PREFERRED EMBODIMENTS

Figure 4:
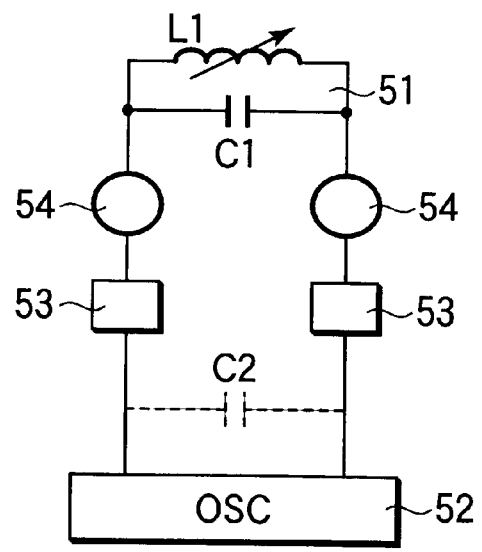
FIG. 4 is a diagram showing a circuit structure of a conventional video signal receiving circuit.
Figure 5:
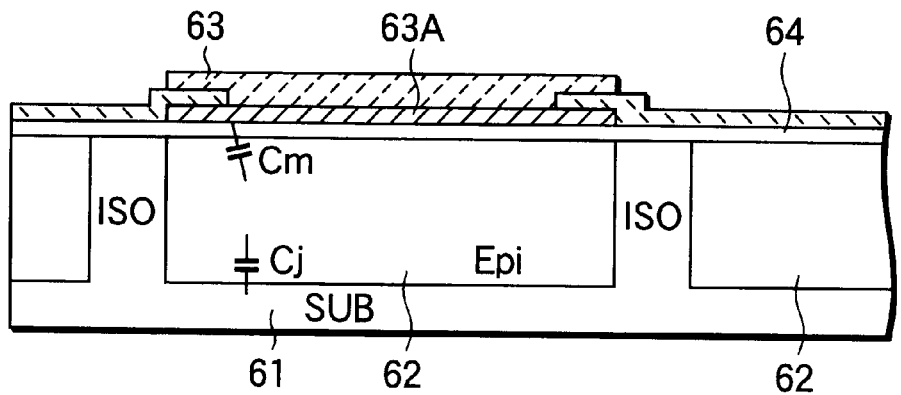
FIG. 5 is a sectional view showing a bonding pad structure of the conventional video signal receiving circuit.
Figure 6:
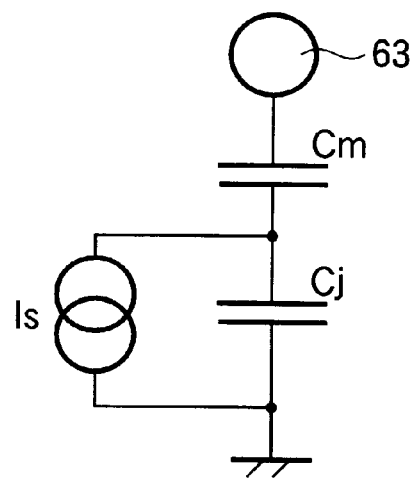
FIG. 6 is a circuit structure diagram for illustrating a parasitic capacity in a bonding pad portion of the conventional video signal receiving circuit.
Figure 7:
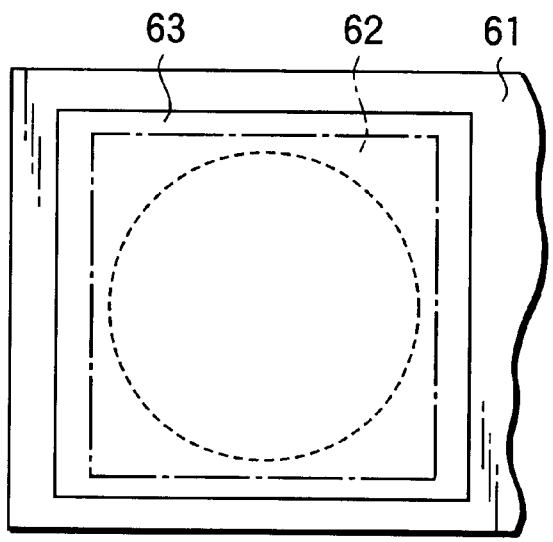
FIG. 7 is a plan view showing a bonding pad structure of the conventional video signal receiving circuit.

A video signal receiving circuit according to an embodiment to which an oscillating circuit of the invention is applied will be described below with reference to the drawings. Since a basic circuit structure of the video signal receiving circuit is equivalent to the circuit structure shown in FIG. 4, description thereof will be omitted to avoid repetitive explanation.

Figure 1:
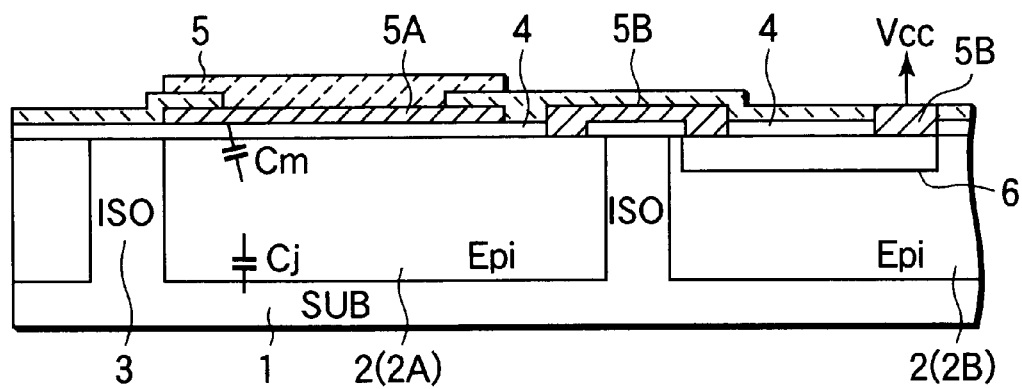
FIG. 1 is a sectional view showing a bonding pad structure of a video signal receiving circuit to which the invention is applied.
Figure 3:
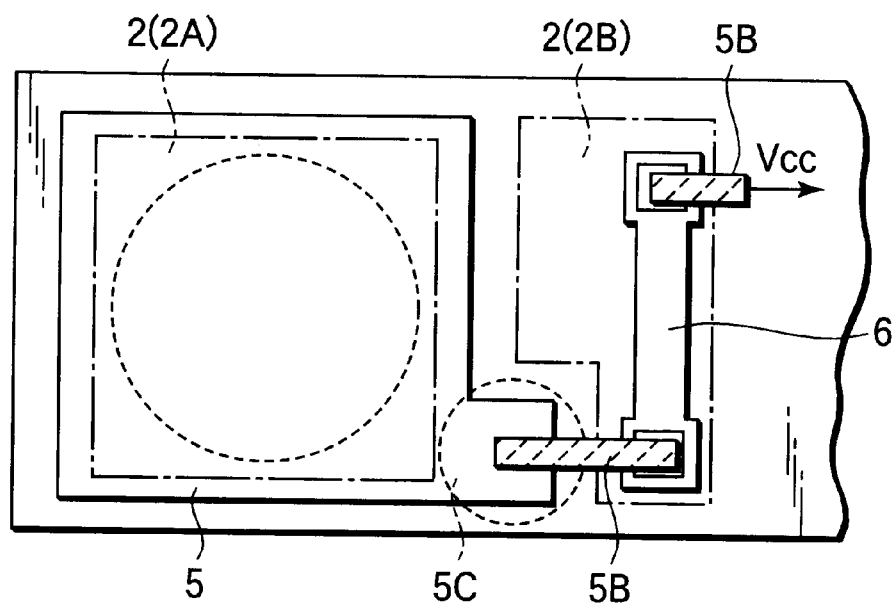
FIG. 3 is a plan view showing the bonding pad structure of the video signal receiving circuit to which the invention is applied.

FIGS. 1 and 3 are sectional and plan views showing a bonding pad structure in the oscillating circuit according to the invention.

In FIGS. 1 and 3, the reference numeral 1 denotes a P-type semiconductor substrate, for example, and the reference numeral 2 denotes an island formed in the substrate 1 (which will be hereinafter referred to as an N-type epitaxial layer 2).

Each epitaxial layer 2 is isolated through an element isolating region (ISO) 3.

Figure 2:
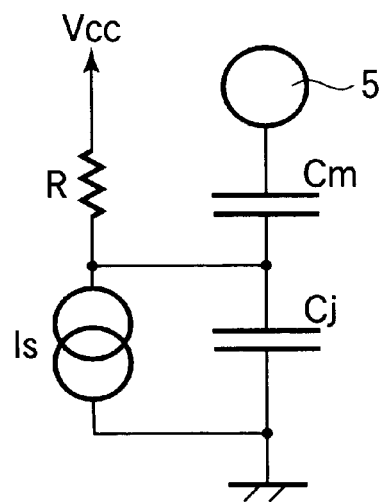
FIG. 2 is a circuit structure diagram for illustrating a parasitic capacity in a bonding pad portion of the video signal receiving circuit to which the invention is applied.

The reference numeral 4 denotes an oxide film formed on the substrate 1, and a bonding pad 5 formed of a metal layer is provided on the epitaxial layer 2 through the oxide film 4. In the same manner as in the conventional art, a MOS capacitance Cm is formed between the epitaxial layer 2 and a single-layered metal 5A provided through the oxide film 4 and a junction capacitance Cj is formed between the (N-type) epitaxial layer 2 and the (P-type) substrate 1 (see FIGS. 1 and 2) . Values of the parasitic capacities are changed depending on a difference in an electric potential between the epitaxial layer 2 and the substrate 1.

In the present invention, therefore, an electric potential in the epitaxial layer which is conventionally set in a floating state is fixed to a predetermined electric potential, a change in the electric potential of the epitaxial layer is quickened and a value of a parasitic capacity is stabilized quickly so that a drift can be improved when a power supply is turned ON.

More specifically, a Vcc voltage is connected into an epitaxial layer 2 (2B) other than the epitaxial layer 2 (2A) (which is adjacent thereto in the embodiment) through a resistor 6 formed of a P-type diffusion layer, for example.

In the invention, thus, the Vcc voltage is connected the epitaxial layer 2A to eliminate the change in the electric potential of the epitaxial layer 2A provided under the bonding pad 5. Consequently, it is possible to eliminate a time taken for stabilizing the electric potential of the epitaxial layer in the conventional art, and to easily carry out a regulating operation.

In the invention, moreover, a contact portion 5C in the bonding pad 5 connected to the resistor 6 through the single-layered metal 5B is formed in a position shifted from a position where wire bonding is to be carried out as shown in FIGS. 1 and 3. There is also a possibility that a crack might be generated on the pad 5 due to a shock when the wire bonding is carried out on the bonding pad 5. In that case, therefore, the Vcc voltage is connected through the resistor 6 having a comparatively high magnitude (approximately 100 KΩ) in order to prevent the substrate 1 from being directly set to a Vcc potential. For the same reason, furthermore, an output port is shifted from the position of the wire bonding.

Moreover, the predetermined electric potential for fixing the electric potential of the epitaxial layer 2A provided under the bonding pad 5 is not restricted to the Vcc voltage but may be a GND voltage, for example, and furthermore, may utilize a predetermined voltage applied from an internal regulator.

Furthermore, while the resistor 6 has been taken as an example of an element having an impedance when the epitaxial layer 2A provided under the bonding pad 5 is fixed to the predetermined electric potential, the invention is not limited thereto but the epitaxial layer 2A may be fixed to a specific electric potential through a diode or a transistor, for example.

Moreover, while the example in which the invention is applied to the video signal receiving circuit has been described in the embodiment, the invention is not restricted thereto but can be applied to various oscillating circuits.

According to the invention, the VCO is not drifted but stabilized when the power supply is turned ON. Therefore, a time is not required for regulating a VCO coil. Moreover, precision in regulation can also be enhanced.

Furthermore, it is sufficient that the bonding pad portion is processed. Therefore, a VCO drift can be improved without affecting various characteristics of an IC.

What is claimed:

1. An oscillating circuit comprising:

an oscillating circuit provided in an integrated circuit;

a resonance circuit provided outside the integrated circuit;

an island provided under a bonding pad connecting the resonance circuit and the oscillating circuit; and an impedance element which is electrically connected with said island and a predetermined electric potential whereby said island is fixed at a predetermined electric potential.

2. The oscillating circuit according to claim 1, wherein said impedance element includes a resistor.

3. The oscillating circuit according to claim 1, wherein said impedance element includes a resistor formed in another island.

4. The oscillating circuit according to claim 1, wherein said predetermined electric potential to which an electric potential of the island is to be fixed is one of a power source voltage and a ground voltage.

5. The oscillating circuit according to claim 1, wherein a contact portion to be connected to said impedance element is formed at a position shifted from a position where wire bonding is carried out.

6. An oscillating circuit comprising:

an oscillating circuit provided in an integrated circuit;

a resonance circuit constituted by an external element of an integrated circuit and an internal element of the integrated circuit;

an island provided under a bonding pad connecting the external element and the internal element of the resonance circuit with the oscillating circuit; and an impedance element which is electrically connected with said island and a predetermined electric potential whereby said island is fixed at a predetermined electric potential.

7. The oscillating circuit according to claim 6, wherein said impedance element includes a resistor.

8. The oscillating circuit according to claim 6, wherein said impedance element includes a resistor formed in another island.

9. The oscillating circuit according to claim 6, wherein said predetermined electric potential to which an electric potential of the island is to be fixed is one of a power source voltage and a ground voltage.

10. The oscillating circuit according to claim 6, wherein a contact portion to be connected to said impedance element is formed at a position shifted from a position where wire bonding is carried out.

* * * * *